United States Patent
Rueda-Aguilocho et al.

(10) Patent No.: US 6,274,824 B1
(45) Date of Patent: Aug. 14, 2001

(54) METHOD OF ARRANGING SIGNAL AND DESTINATION PADS TO PROVIDE MULTIPLE SIGNAL/DESTINATION CONNECTION COMBINATIONS

(75) Inventors: Mario Rueda-Aguilocho; Darryl G. Webster; Paul Pickersgill, all of Cadiz (ES)

(73) Assignee: Visteon Global Technologies, Inc., Dearborn, MI (US)

(*) Notice: Subject to any disclaimer, the term of this patent is extended or adjusted under 35 U.S.C. 154(b) by 0 days.

(21) Appl. No.: 08/829,293

(22) Filed: Mar. 31, 1997

(51) Int. Cl.$^7$ ....................................... H01R 9/09
(52) U.S. Cl. ................ 174/261; 174/262; 361/760; 361/774; 361/777
(58) Field of Search ................... 174/250, 254, 174/261, 262; 361/760, 782, 774, 777, 805; 257/734; 439/68, 83, 526; 333/128, 136, 127

(56) References Cited

U.S. PATENT DOCUMENTS

| | | |
|---|---|---|
| 3,539,705 | 11/1970 | Nathanson et al. ................ 174/254 |
| 3,898,370 | 8/1975 | Davy et al. ........................ 174/261 |
| 4,874,907 * | 10/1989 | Ishikawa .......................... 361/774 |
| 5,061,825 | 10/1991 | Catlin .............................. 174/261 |
| 5,216,280 * | 6/1993 | Tanaka et al. .................... 257/734 |
| 5,237,131 | 8/1993 | Caitlin ............................. 174/261 |
| 5,264,664 * | 11/1993 | McAllister et al. ............... 174/261 |
| 5,266,747 | 11/1993 | Cheorghiu et al. ............... 174/254 |
| 5,418,455 | 5/1995 | Takaishi et al. ................ 324/207.21 |

FOREIGN PATENT DOCUMENTS

| | | |
|---|---|---|
| 0395612A2 | 12/1992 | (EP) . |
| 04368197 | 6/1990 | (JP) . |
| 5-13899 * | 1/1993 | (JP) ............................. 174/250 |
| 07086729 | 3/1995 | (JP) . |

* cited by examiner

Primary Examiner—Albert W. Paladini
(74) Attorney, Agent, or Firm—John Kajander

(57) ABSTRACT

An electronic circuit assembly having an arrangement of signal and destination pads for two or more signals which provides multiple signal/destination connection combinations. One embodiment of the present invention includes n signal pads and n destination pads, where n is a number greater than one. The signal pads and destination pads are arranged on a substrate in a polygonal array in an alternating signal pad/destination pad pattern. In a preferred embodiment, the polygonal array has the shape of a right polygon.

12 Claims, 6 Drawing Sheets

METHOD OF ARRANGING SIGNAL AND DESTINATION PADS TO PROVIDE MULTIPLE SIGNAL/DESTINATION CONNECTION COMBINATIONS

BACKGROUND OF THE INVENTION

1. Field of the Invention

The present invention relates generally to electronic circuits. More particularly, the present invention relates to a method of arranging signal and destination pads in electronic circuits to provide multiple signal/destination connection configurations.

2. Disclosure Information

In electronic circuits, components are attached to a substrate and the inputs and outputs of the components are interconnected by wires or, more typically, circuit traces. Circuit traces electrically connect an output terminal, or signal origination, of one component to an input terminal, or signal destination, of another component. An individual circuit trace may consist of a single path having only one origination and one destination, or it may be branched so as to have multiple originations and/or destinations. In either case, each end of a circuit trace usually terminates in a pad, to which a component input or output terminal is attached.

When a circuit is designed, it is generally laid out such that each of the components may be oriented in only one way on the circuit substrate. However, it may sometimes be desired to lay out a circuit such that one or more components may be oriented in more than one way, so that more than one configuration of signal/destination connections can be made using a single circuit trace layout. This idea is illustrated in FIG. 1. Here, a signal circuit trace 20 having two signal pads 21/22, and two destination circuit traces 30/35 each having one destination pad 31/36, respectively, have been laid out on a substrate 50. The signal trace 20 is attached at one end to an output terminal (signal origination) of an electronic component, while the destination traces 30/35 are each attached to an input terminal (signal destination) of another component. Although these components and their terminals are not shown, the signal originations are denoted by single-digit reference numerals 1, 2, 3, and so forth, and the signal destinations are denoted by reference letters A, B, C, and so forth.

Once the circuit traces 20/30/35 have been laid out on the substrate 50 as shown in FIG. 1, the circuit can then be populated with components. At this point, the substrate populator has the option of attaching a jumper 10 (1) between signal pad 21 and destination pad 31, thereby connecting signal 1 with destination A, or (2) between signal pad 22 and destination pad 36 (as indicated by the dashed outline of a jumper 10), thereby connecting signal 1 with destination B. In either combination, a unique circuit is produced. Thus it can be seen that a single circuit trace arrangement may be populated with jumpers 10 in more than one way so as to provide more than one signal/destination connection combination (hereinafter referred to as an "SDCC"). This means that rather than producing two separate circuit trace arrangements—e.g., two unpopulated printed circuit boards (PCBs)—which have similar layouts except for a few signal/destination connections, it is possible to use the foregoing multiconfigurable pad arrangement to produce only one such circuit trace/PCB which has the possibility of producing either of two SDCCs. In short, one circuit/PCB using the foregoing pad arrangement can take the place of two separate but similarly laid out circuits/PCBs.

FIG. 1 illustrates a prior art attempt at providing more than one SDCC for one signal origination 1 and two potential destinations A/B. This arrangement offers two possible SDCCs: 1A (i.e., signal 1 to destination A) and 1B. FIG. 2 illustrates the prior art case for two signals 1/2 and two destinations A/B, which also provides two possible connection combinations: 1A/2B and 1B/2A. FIG. 3 illustrates an arrangement of three signals 1/2/3 and three destinations A/B/C, which once again offers two possible connection combinations: 1A/2B/3C and 1B/2C/3A.

Several things should become apparent from the arrangements presented in FIGS. 1–3. First, the layout of the signals and destinations may be re-arranged in many different ways to achieve the same result. For example, FIG. 4 illustrates one of the many ways in which the three signals 1/2/3 and three destinations A/B/C of FIG. 3 may be re-arranged to produce the same two possible SDCCs as FIG. 3. Second, the signals and destinations may be arranged so as to present different sets of two SDCCs. To illustrate this, note that with three signals and three destinations, 3-factorial, or six, SDCCs are possible in all:

| I | II | III | IV | V | VI |
|---|---|---|---|---|---|
| 1A | 1A | 1B | 1B | 1C | 1C |
| 2B | 2C | 2A | 2C | 2A | 2B |
| 3C | 3B | 3C | 3A | 3B | 3A |

(This assumes, of course, that each signal is connected to one and only one distinct destination, and vice versa.) However, although three inputs and three outputs can be arranged in six different SDCCs, only two may be provided for according to the foregoing pad arrangement without adding additional pads. FIG. 5 illustrates one way of arranging the same three signals 1/2/3 and destination pads A/B/C to provide two different SDCCs: 1B/2A/3C and 1C/2A/3B. Third, it should become apparent that the number of signals does not have to equal the number of destinations. For example, FIG. 1 presents the case of one signal 1 and two destinations A/B. Fourth, note that an arrangement having n signals and at least n destinations requires the use of 4n pads. Thus, in FIG. 1 where n=1, four pads are required. In FIG. 2 where n=2, eight pads are needed, and in FIGS. 3–5 where n=3, twelve pads are needed.

Furthermore, several assumptions underlie the prior art arrangements shown in FIGS. 1–5. First, each signal origination and each signal destination may have multiple pads, but each signal must ultimately connect with one and only one signal destination, regardless of which particular pads are jumpered together; likewise, each signal destination must ultimately connect with one and only one signal origination. Second, each signal pad may be connected to no more than one destination pad, and vice versa. Third, each signal or destination pad can have no more than one jumper attached to it. Fourth, jumpers may not cross one another.

Another prior art approach which is an improvement upon the aforementioned one signal-two destination arrangement of FIG. 1, and which also relies upon the assumptions discussed above, is illustrated in FIG. 6. This approach differs from the one pictured in FIG. 1 in that (1) the two signal pads 21/22 and their associated branches have been combined to form only one signal pad 23 and one branch, and (2) the signal pad 23 has been interposed between the two destination pads 31/36. This combination and interposition allows a jumper 10 to be placed either between signal 1 and destination A, as shown in FIG. 6, or between signal 1 and destination B, as represented by the dashed outline. Thus, this improved approach allows the same connection combinations as allowed by FIG. 1, but with the added benefit of requiring only three pads rather than four, thereby taking up less space on the substrate 50.

Although the foregoing prior art approaches are effective ways of arranging signal and destination pads so as to provide multiple SDCCs, they nonetheless suffer some serious drawbacks. First, the methods illustrated in FIGS. 1–5 take up a lot of space on the substrate. Second, these methods provide an undesirable dangling signal trace for each signal in either of the two possible connection combinations. For example, when the jumpers are positioned as shown in FIG. 2, signal pads 22 and 27 and their associated branches form dangling signal traces for signals 1 and 2, respectively. Likewise, when the alternate, dashed-line connections are made in FIG. 2, pads 21 and 26 and their associated branches form dangling traces. (The arrangements shown in FIGS. 3–5 also leave a dangling trace for each signal 1/2/3.) These dangling traces may act as unwanted RF transmitters or receivers, thus interfering with the electrical function of elements within the circuit or with other circuits and equipment in the surrounding environment. As for the approach shown in FIG. 6, dangling traces have been eliminated and the number of pads reduced, but its application has been limited to cases involving only one signal and two possible destinations.

It is desirable, therefore, to provide a way of arranging signal and destination pads on a substrate for multiple (i.e., two or more) signals and an equal or greater number of destinations so as to provide multiple SDCCs while eliminating dangling traces and reducing the overall number of pads required.

SUMMARY OF THE INVENTION

The present invention overcomes the disadvantages of the prior art by providing an electronic circuit assembly having an arrangement of signal and destination pads for two or more signals which provides multiple SDCCs. One embodiment of the present invention comprises n signal pads and n destination pads, where n is a number greater than one. The signal pads and destination pads are arranged on a substrate in a polygonal array in an alternating signal pad/destination pad pattern. In a preferred embodiment, the polygonal array has the shape of a right polygon.

It is an advantage that the number of pads required to provide multiple SDCCs for two or more signals according to the present invention is significantly reduced as compared to the prior art.

It is a further advantage that the present invention provides multiple SDCCs for two or more signals while completely eliminating dangling signal traces.

Another advantage is that the present invention provides a higher number of possible SDCCs for each arrangement of two or more signals than does the prior art.

Yet another advantage is that the present invention may be applied to a wide range of applications, including printed circuit boards, microelectronics, and integrated circuit applications.

These and other advantages, features and objects of the invention will become apparent from the drawings, detailed description and claims which follow.

DETAILED DESCRIPTION OF THE PREFERRED EMBODIMENTS

Figure 1:
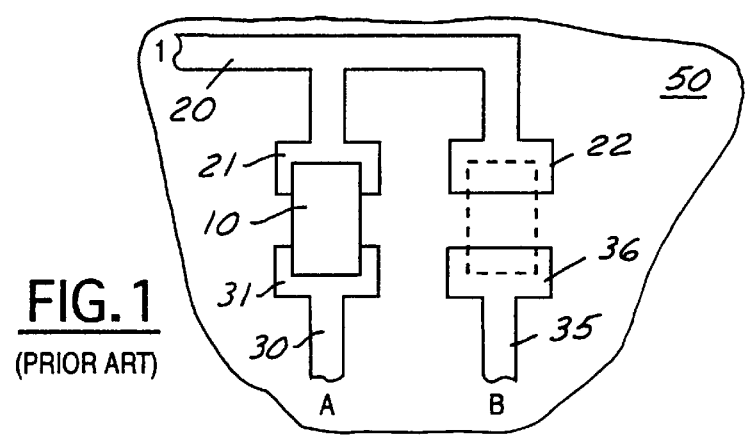
FIG. 1 is a top plan view of a circuit portion having one signal and two destinations according to the prior art.
Figure 2:
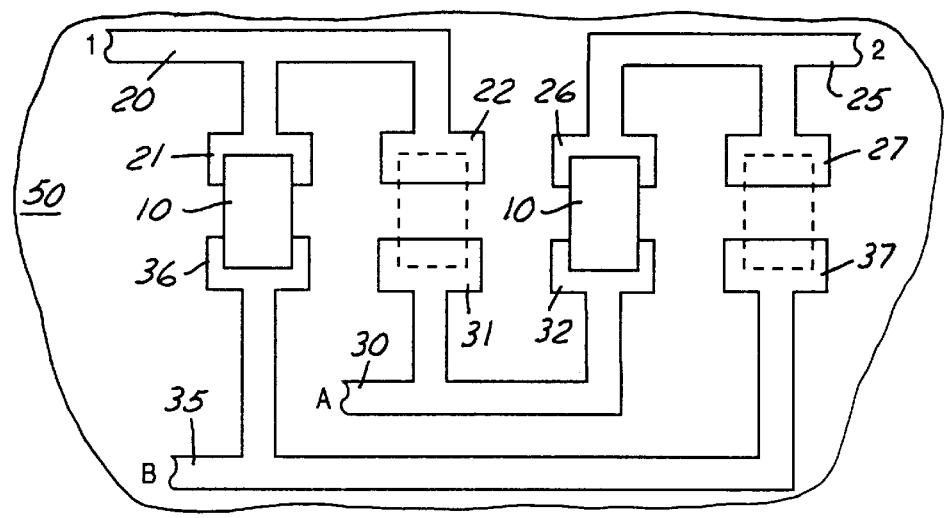
FIG. 2 is a top plan view of a circuit portion having two signals and two destinations according to the prior art.
Figure 3:
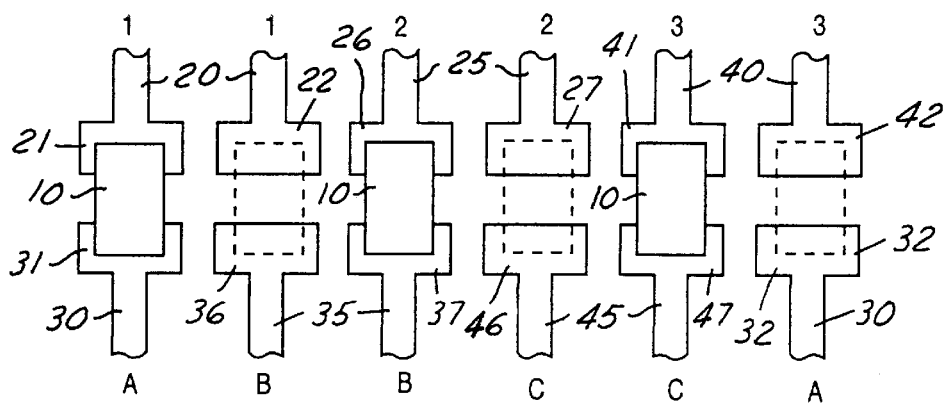
FIG. 3 is a top plan view of a circuit portion having three signals and three destinations according to the prior art.
Figure 4:
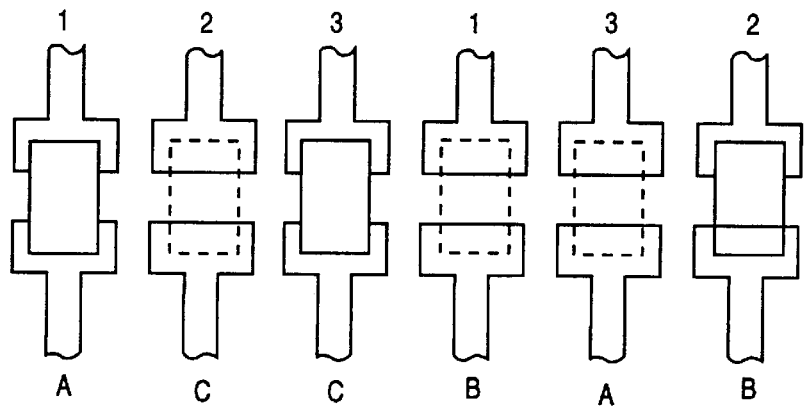
FIG. 4 is a top plan view of an alternative version of a circuit portion having three signals and three destinations according to the prior art.
Figure 5:
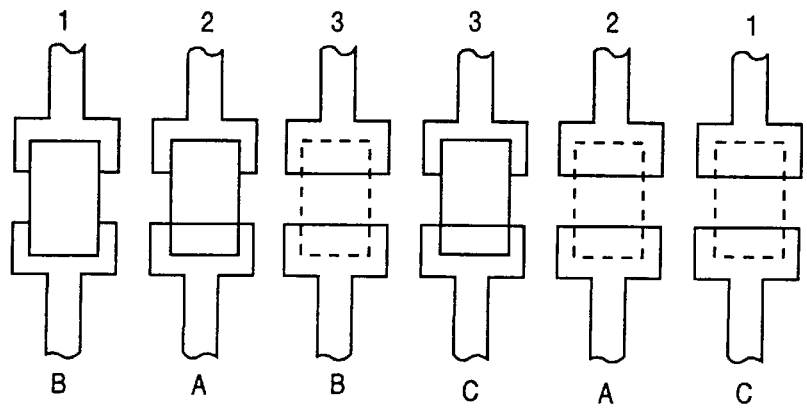
FIG. 5 is a top plan view of another alternative version of a circuit portion having three signals and three destinations according to the prior art.
Figure 6:
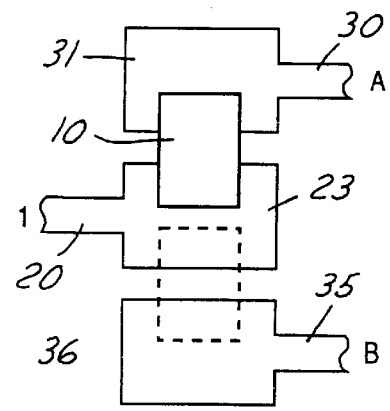
FIG. 6 is a top plan view of a circuit portion having one signal and two destinations according to an improvement within the prior art.
Figure 7:
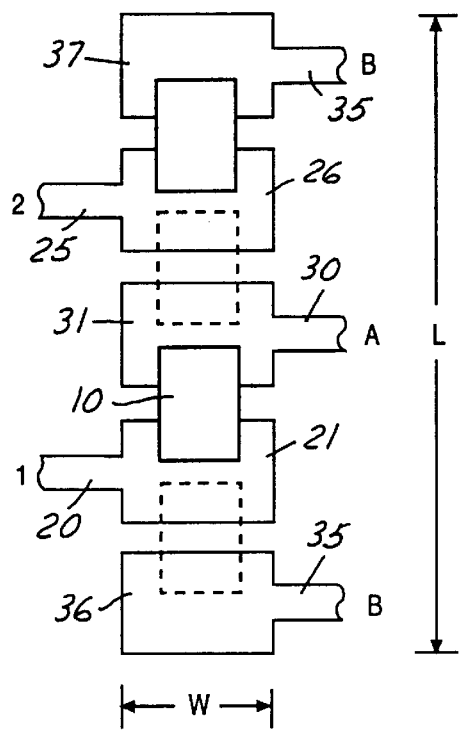
FIGS. 7–8 are top plan views of circuit portions according to a first embodiment of the present invention having, respectively, 2 signals/2 destinations and 3 signals/3 destinations.

Referring now to the drawings, FIG. 7 shows a first embodiment of the present invention, comprising n signal pads and n+1 destination pads, where n is a number greater than one. FIG. 7 illustrates the case where n=2. Signals 1 and 2 are carried by circuit traces 20 and 25, respectively, which terminate in signal pads 21 and 26, respectively. Signal destinations A and B are connected to circuit traces 30 and 35, respectively, which terminate in destination pads 31 and 36/37, respectively. The signal pads 21/26 and destination pads 31/36/37 are arranged on a substrate 50 in a linear array, wherein a first endmost pad of the array is a first destination pad 36, a next closest pad in the array is a first signal pad 21, a next closest pad in the array is a second destination pad 31, and so forth in an alternating signal pad/destination pad pattern, wherein a second endmost pad in the array is a last destination pad 37.

The foregoing example illustrates one way in which the respective pads of two signals 1/2 and two destinations A/B may be arranged according to a first embodiment of the present invention. However, other specific arrangements are possible using these same signals 1/2 and destinations A/B. For example, the positioning of signals 1 and 2 may be reversed, such that signal 1 is carried by trace 25 and signal 2 is carried by trace 20, and/or destinations A and B may be reversed such that destination A is connected to trace 35 and destination B is connected to trace 30. Thus, what is important is the arrangement and pattern of the signal and destination pads, rather than the order or arrangement of the respective signals and destinations to which the pads are connected. For example, in the present embodiment it is important that the first endmost pad in the array be a first destination pad (as opposed to a signal pad), not that it be connected by a circuit trace to any particular destination.

As shown in FIG. 7, the last destination pad 37 may have a signal destination B in common with that of the first destination pad 36. This arrangement offers two possible SDCCs: 1A/2B and 1B/2A, depending upon how jumpers 10 are positioned. Alternatively, the last destination pad 37 may be connected to a (i.e., distinct) destination C (not shown); this would offer possible SDCCs of 1A/2C and 1B/2A. Thus, it should become apparent that for a given n, there may be either n or n+1 destinations to which the destination pads are connected, depending, respectively, on whether the last destination pad 37 is connected to a repeated destination (e.g., B) or to a unique destination (e.g., C).

Figure 8:
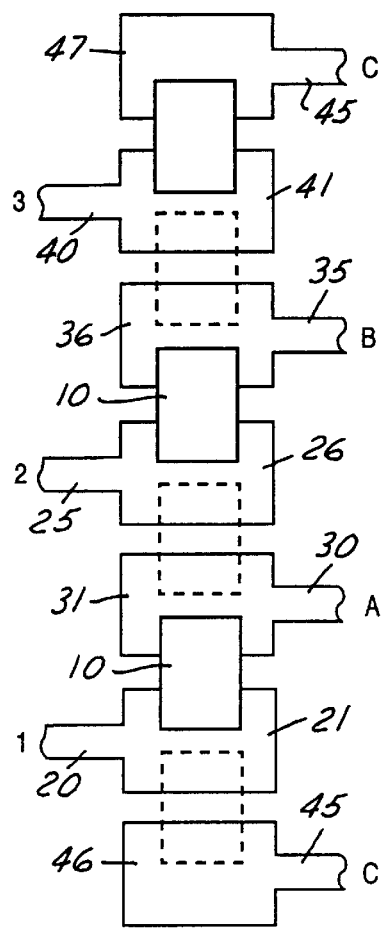

FIG. 8 illustrates the case where n=3. As in FIG. 7, note the alternating destination pad/signal pad pattern, which utilizes n signal pads 21/26/41 and n+1 destination pads 46/31/36/47. It should also be noted that in the present embodiment (1) each signal pad is electrically connected to a unique (non-repeated) signal origination (in order to avoid dangling traces), (2) the arrangement provides two possible SDCCs, and (3) n jumpers are arranged so as to connect each signal pad to only one destination pad and each destination pad to only one signal pad.

Figure 9:
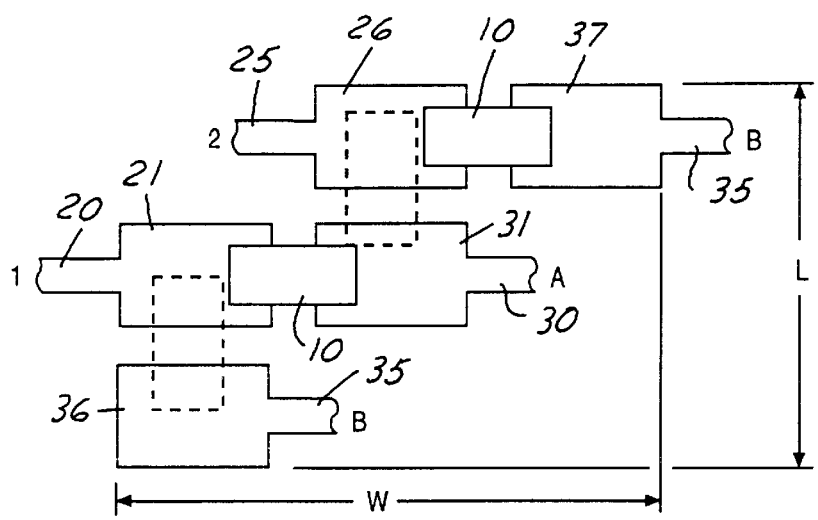
FIGS. 9–10 are top plan views of circuit portions according to a second embodiment of the present invention having, respectively, 2 signals/2 destinations and 3 signals/3 destinations.
Figure 10:
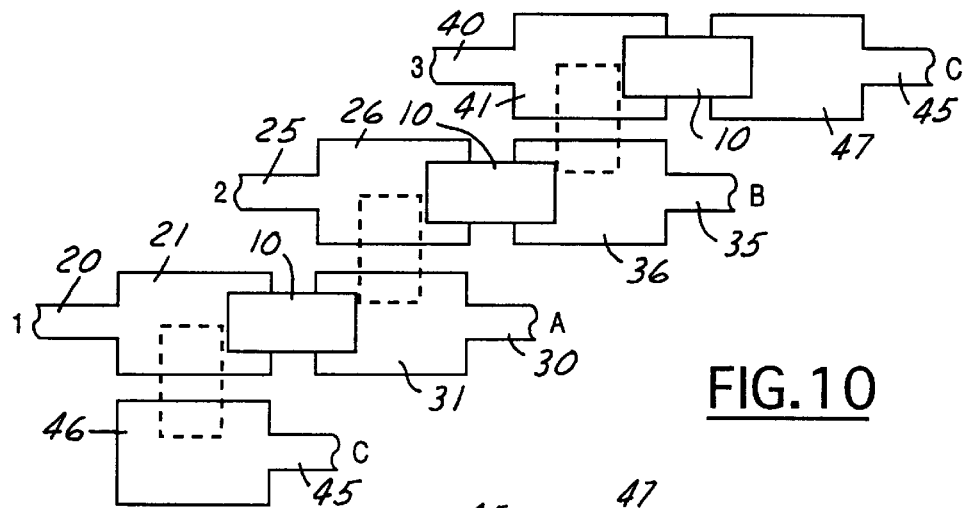

FIGS. 7 and 8 illustrate the case where the linear array of signal and destination pads is laid out in a substantially straight line. It should also be noted that the linear array may be laid out in a substantially stair-step-shaped line, giving rise to a second embodiment of the present invention. This is illustrated in FIGS. 9 and 10 for the cases of n=2 and n=3, respectively. The clustered, stair-step arrangement of this embodiment has an advantage over the linear arrangement of the first embodiment in that its length L is generally shorter, albeit its width W is generally wider. Also note that whereas in the first embodiment all of the jumpers 10 are oriented substantially along a straight line in either of the two possible SDCCs, in FIGS. 7 and 8 the jumpers 10 are arranged either all "horizontally" in one SDCC (as pictured in FIGS. 9 and 10) or all "vertically" in the other SDCC (as represented by the dashed jumper outlines).

Figure 11:
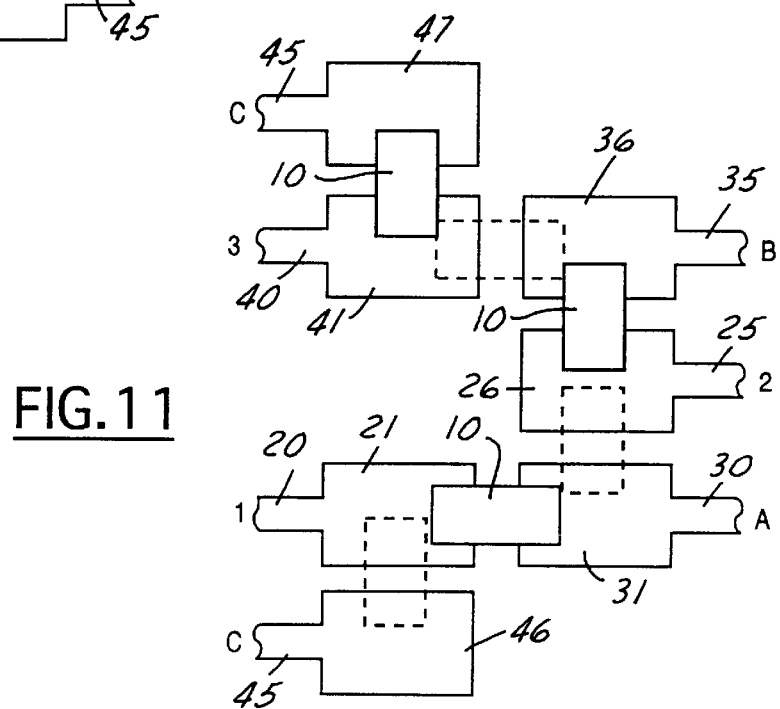
FIGS. 11–12 are top plan views of alternative versions of the embodiment shown in FIG. 10.
Figure 12:
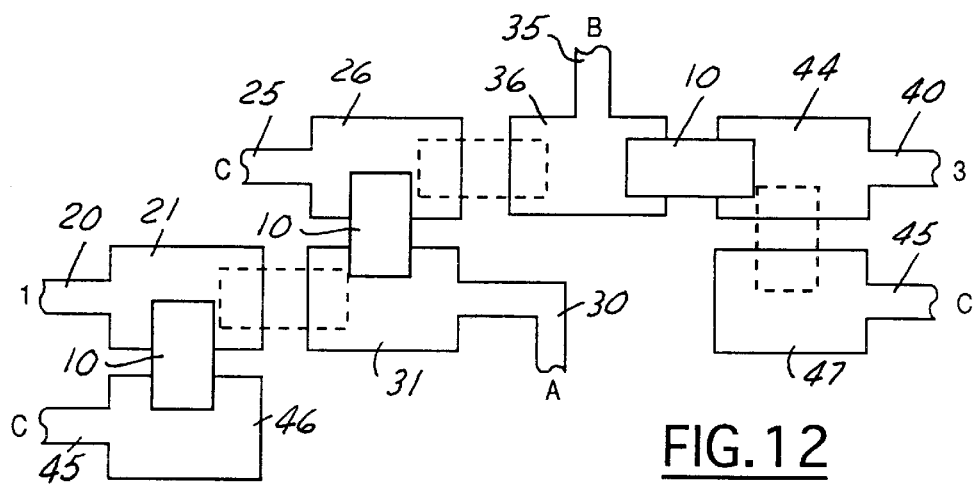

FIGS. 11 and 12 illustrate alternative examples of pad layouts for the case of n=3 according to the substantially stair-step-shaped linear array of the present embodiment. As in FIG. 10, these two arrangements provide SDCCs of 1A/2B/3C and 1C/2A/3B, yet all three arrangements are different in layout. This illustrates how the circuit designer has multiple pad configurations at his or her disposal for a given number of signals and destinations, yet with all providing the same possible SDCCs. This allows the circuit designer to lay out the circuit in a way that best utilizes substrate real estate.

The pads in FIGS. 9–12 are arranged in a linear array described as being substantially stair-step-shaped. This shape can be seen by drawing a line connecting a first endmost pad to the next adjacent pad, and so on, until a second endmost pad is reached. The resulting shape produced is a line having stair-step-like, orthogonal bends therein. Thus, the substantially stair-step-shaped linear array of the present embodiment includes any linear array of pads having at least one orthogonal bend therein, so long as the array allows jumpers 10 to be placed so as to connect adjacent pads. However, the shape of the array need not have a stair-step (orthogonal bend) at every possible turn. For example, in FIG. 11, note that no bend occurs in the line drawn between pads 31, 26, and 36; likewise, no bend occurs in FIG. 12 among pads 26, 36, and 41.

Figure 13:
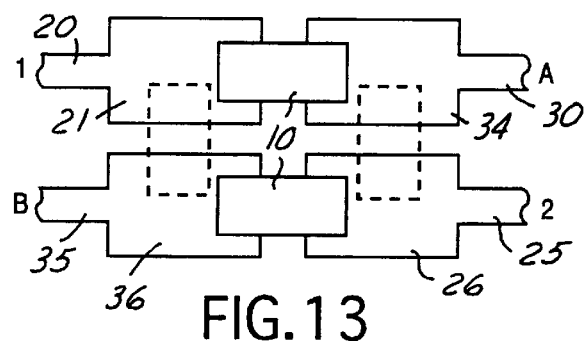
FIGS. 13–14 are top plan views of circuit portions according to a third embodiment of the present invention having, respectively, 2 signals/2 destinations and 3 signals/3 destinations.
Figure 14:
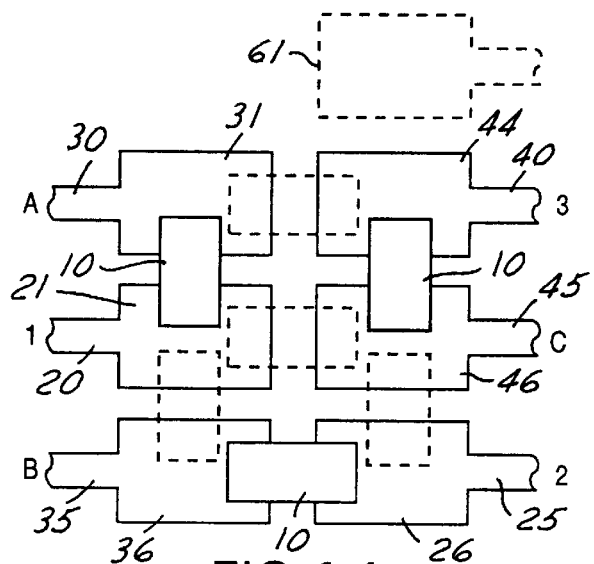
Figure 15:
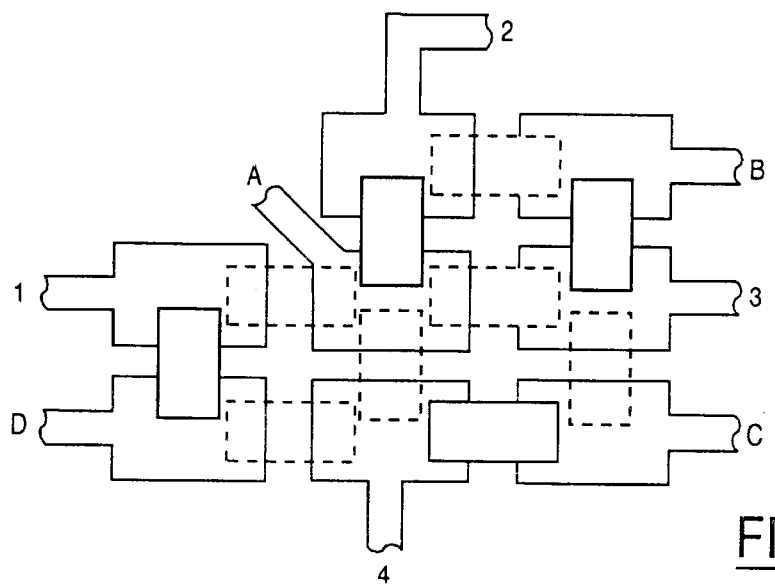
FIGS. 15–16 are top plan views of circuit portions according to a third embodiment of the present invention having 4 signals/4 destinations.
Figure 16:
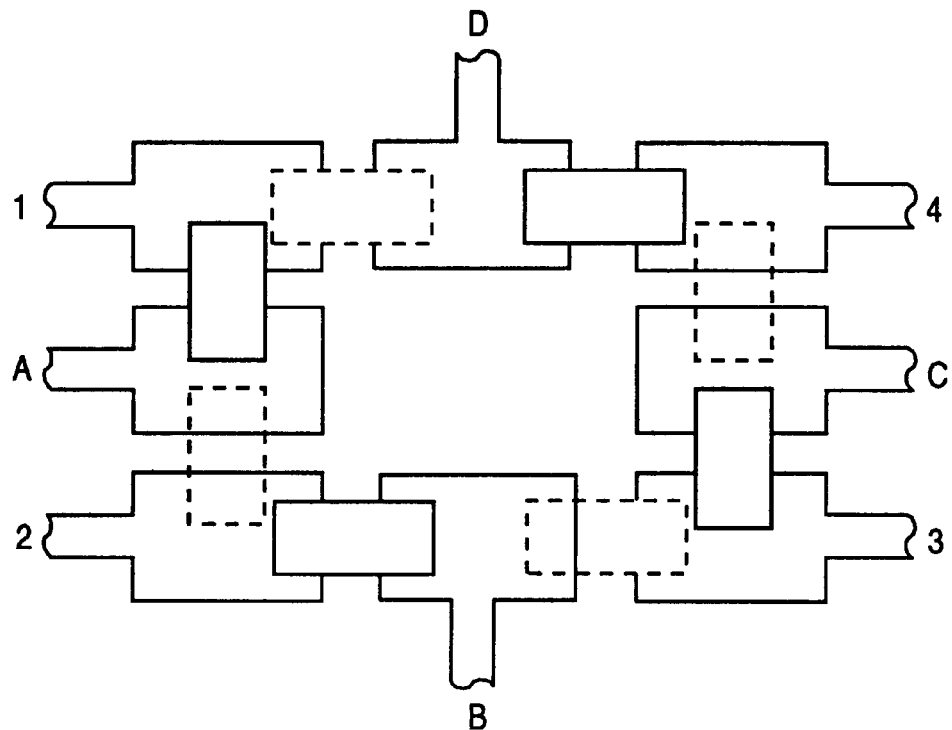

A third, preferred embodiment is illustrated in FIGS. 13 and 14 for the cases of n=2 and n=3, respectively, and in FIGS. 15 and 16 for the case of n=4. This embodiment comprises n signal pads and n destination pads, where n is a number greater than one. The signal pads and destination pads are arranged on a substrate in a polygonal array in an alternating signal pad/destination pad pattern. As in the first two embodiments, the signal pads and destination pads are arranged so as to allow jumper connections between adjacent pads, and each signal pad is electrically connected to a unique signal origination. However, unlike the first two embodiments, no two destination pads may be connected to the same destination. Rather, each destination pad is electrically connected to a unique signal destination. Furthermore, whereas the first two embodiments had the advantage over the prior art that only 2n+1 pads are needed rather than 4n pads, the present embodiment has the further advantage that only 2n pads are needed, due to its polygonal, alternating pad configuration. Moreover, the present embodiment offers more than two SDCCs for n greater than 2. For example, in FIG. 14 where n=3, the possible SDCCs are: 1A/2B/3C, 1B/2C/3A, and 1C/2B/3A.

The pad array of the present embodiment is described as being polygonal. This polygonal shape can be seen by drawing a line from pad to pad along the entire perimeter of the pad array; the resulting shape is that of a closed polygon. The present embodiment may be used with any polygonal shape; however, the preferred shape is that of a right polygon (i.e., a polygon in which all angles are right angles).

Figure 17:
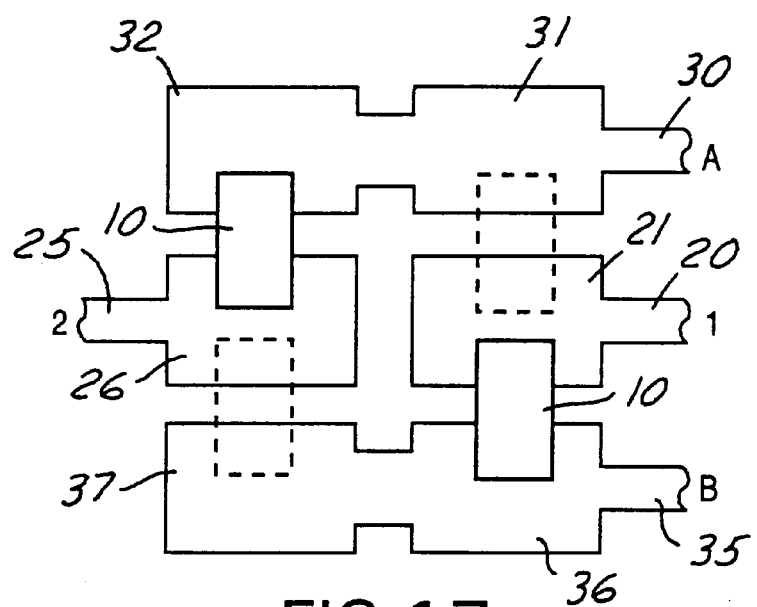
FIG. 17 is a top plan view of a circuit portion according to a fourth embodiment of the present invention having 2 signals/2 destinations.

A fourth embodiment is illustrated in FIG. 17, in which one or more destination circuit traces may have more than one destination pad attached thereto. In this embodiment, a first circuit trace 30 has first and second destination pads 31/32 located thereon, and a second circuit trace 35 has third and fourth destination pads 36/37 located thereon. A first signal pad 21 is positioned so as to be connectable by a jumper 10 to either of the first and third destination pads 31/36, while a second signal pad 26 is positioned so as to be connectable by a jumper 10 to either of the second and fourth destination pads 32/37. All of the signal and destination pads are arranged on a substrate 50. In this arrangement, SDCCs of 1A/2B and 1B/2A are possible; however, dangling traces 32 and 37, respectively, are created, making this a generally non-preferred configuration. There are some applications, however, in which the present embodiment may in fact be preferred over the foregoing embodiments. One such application is in wave soldering of PCBs, in which it is desirable that all of the jumpers 10 be oriented or "pointing" in a given direction, as is the case in the present embodiment.

Each jumper 10 used in the foregoing embodiments may be a substantially zero-ohm conductor or any bipolar electronic device such as a resistor, capacitor, or the like. Of course, two or more jumpers 10 may be combined to form a multipolar device capable of simultaneously spanning and interconnecting two or more signal pads and two or more destination pads. It should be noted that the words "unique" and "distinct" are used synonymously herein to describe certain signals and destinations. A unique/distinct signal is one to which one and only one destination is electrically connected (i.e., through pads and jumpers) in a given SDCC, and a unique/distinct destination is one to which one and only one signal is electrically connected in a given SDCC.

Various other modifications to the present invention will, no doubt, occur to those skilled in the art to which the present invention pertains. First, not every pad need be connected to another. To illustrate, in FIG. 14 a possible SDCC may be 1A/2B/3-, denoting that signal 3's pad 41 is not jumpered to any available destination (i.e., pad 46). Second, it is possible to add signal and/or destination pads to the basic configurations described above in order to provide additional SDCCs (albeit at the expense of substrate space). For example, in FIG. 14, an additional destination pad 61 (drawn in phantom) may be placed adjacent signal pad 41. This additional pad 61 may, for instance, be connected to a repeated destination, such as B, or to an added, unique destination, such as D. In the former case, an additional SDCC of 1A/2C/3B would be provided; in the latter case, four additional SDCCs of 1A/2B/3D, 1A/2C/3D, 1B/2C/3D, and 1C/2B/3D would be provided. Third, it should be noted that although the circuit traces connecting pads to their respective signals or destinations have been illustrated as being on a top surface of the substrate, these traces may also be formed within the substrate itself (e.g., using plated through-holes, buried conductors, etc.). And fourth, the "pad" at the end of each circuit trace may have a shape different from that shown in the drawings. Other modifications in addition to these mentioned may also be possible. It is the following claims, including all equivalents, which define the scope of the invention.

What is claimed is:

1. An electronic circuit assembly comprising:

n signal pads which are disposed upon a substrate and which each has a distinct signal origination; and n destination pads which are disposed upon said substrate, which each has a distinct signal destination, and which cooperate with said n signal pads to form an adjacent alternating polygonal arrangement, effective to allow each of said n signal pads to be connected to each of said n destination pads.

2. The electronic circuit assembly of claim 1 wherein said polygonal arrangement comprises a square arrangement.

3. The electronic assembly of claim 1 wherein said polygonal arrangement comprises a rectangular arrangement.

4. An electronic circuit assembly comprising:

n destination pads;

n signal pads;

said n destination pads and said n signal pads being selectively disposed upon a substrate member in a rectangular and adjacent alternating relationship; and a plurality of jumpers which interconnect said n destination pads and said n signal pads, such that at least one of said destination pads is selectively connected to each of said n signal pads.

5. The electronic circuit assembly of claim 4 wherein said n signal pads comprise three signal pads.

6. The electronic circuit assembly of claim 4 wherein said at least one of said destination pads is selectively connected to four signal pads.

7. The electronic circuit assembly of claim 4 wherein said plurality of jumpers is further effective to selectively connect at least one of said signal pads to each of said n destination pads.

8. The electronic circuit assembly of claim 7 wherein said n destination pads comprise three destination pads.

9. A method of arranging n signal pads and n destination pads on a circuit assembly, said method comprising the steps of:

providing a substrate;

selectively disposing said n signal pads and said n destination pads in a generally rectangular and alternating arrangement upon said substrate;

selectively connecting each of said n signal pads to at least two of said n destination pads; and selectively connecting each of said n destination pads to at least two of said n signal pads.

10. The electronic assembly of claim 9 wherein at least one of said n signal pads is selectively connected to three of said destination pads.

11. The electronic assembly of claim 10 wherein at least one of said n destination pads is selectively connected to three of said signal pads.

12. The electronic assembly of claim 9 wherein at least one of said n destination pads is selectively connected to four of said signal pads.

* * * * *